(12) United States Patent
Wadekar et al.

(10) Patent No.: US 10,236,843 B2
(45) Date of Patent: Mar. 19, 2019

(54) HIGH GAIN DIFFERENTIAL AMPLIFIER WITH COMMON-MODE FEEDBACK

(71) Applicant: Synopsys, Inc., Mountain View, CA (US)

(72) Inventors: Jayesh Wadekar, Pune (IN); Ravi Mehta, Karnataka (IN); Biman Chattopadhyay, Karnataka (JP)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/862,510

(22) Filed: Jan. 4, 2018

(65) Prior Publication Data

US 2018/0323760 A1  Nov. 8, 2018

(30) Foreign Application Priority Data

May 3, 2017  (IN) .............................. 201741015555

(51) Int. Cl.
*H03F 3/45* (2006.01)
*H03F 3/72* (2006.01)

(52) U.S. Cl.
CPC ..... *H03F 3/45183* (2013.01); *H03F 3/45237* (2013.01); *H03F 3/45273* (2013.01); *H03F 3/45475* (2013.01); *H03F 3/72* (2013.01)

(58) Field of Classification Search
CPC ............ H03F 3/45183; H03F 3/45237; H03F 3/45273; H03F 3/45475; H03F 3/72; H03F 2200/177; H03F 3/45179; H03F 3/45192; H03F 3/45174; H03F 3/45372; H03F 3/4547; H03F 2203/45054; H03F 2203/45096; H03F 2203/45124; H03F 3/45071; H03F 3/45085; H03F 1/34; H03F 3/45479; H03F 3/4565; H03F 3/45659; H03G 1/0023; H03G 1/0029; H03G 1/0035; H03G 1/0088; H03G 3/00; H03G 2201/10
USPC ................................ 330/253, 254, 257, 258
See application file for complete search history.

(56) References Cited

U.S. PATENT DOCUMENTS

| | | | | |
|---|---|---|---|---|
| 4,272,728 A | * | 6/1981 | Wittlinger | ........... H03F 3/45085 330/253 |
| 4,568,885 A | * | 2/1986 | McKenzie | .......... H03F 3/45753 330/253 |
| 7,538,613 B2 | * | 5/2009 | Seth | .................... H03F 3/45183 330/258 |
| 8,552,801 B2 | | 10/2013 | Myles | |

OTHER PUBLICATIONS

Jafar Savoj et al. "A 10-Gb/s CMOS Clock and Data Recovery Circuit With a Half-Rate Linear Phase Detector," IEE: Journal of Solid-State Circuits, vol. 36, No. 5, May 2001, pp. 761-768.

* cited by examiner

*Primary Examiner* — Khanh V Nguyen (74) *Attorney, Agent, or Firm* — Fenwick & West LLP (57) ABSTRACT

A high gain differential amplifier includes first through eighth transistors, first through third degeneration resistors, and first through third current sources. The fourth and fifth transistors form a p-type metal-oxide-semiconductor (PMOS) transistor pair. Further, the second and eighth transistors form a current mirror circuit. The PMOS transistor pair and the current mirror circuit form a common mode feedback circuit. The high gain differential amplifier controls the common-mode output voltage with the common mode feedback circuit and a reference voltage.

13 Claims, 7 Drawing Sheets

HIGH GAIN DIFFERENTIAL AMPLIFIER WITH COMMON-MODE FEEDBACK

CROSS-RELATED APPLICATIONS

This application claims priority of Indian non-provisional Application Serial No. 201741015555, filed May 3, 2017, the contents of which are incorporated herein by reference.

FIELD OF THE INVENTION

The present invention relates generally to integrated circuits, and more specifically to differential amplifiers.

DESCRIPTION OF THE RELATED ART

Differential circuits are widely used for designing mixed-signal systems due to their ability to effectively reject ambient noise signals in the mixed-signal systems. Examples of the ambient noise signals include supply noise, reference noise, substrate noise, and the like. The ambient noise signals distort input and output signals in circuit implementations of the mixed-signal systems. A differential amplifier is one such circuit implementation of the differential circuits.

Figure 1:
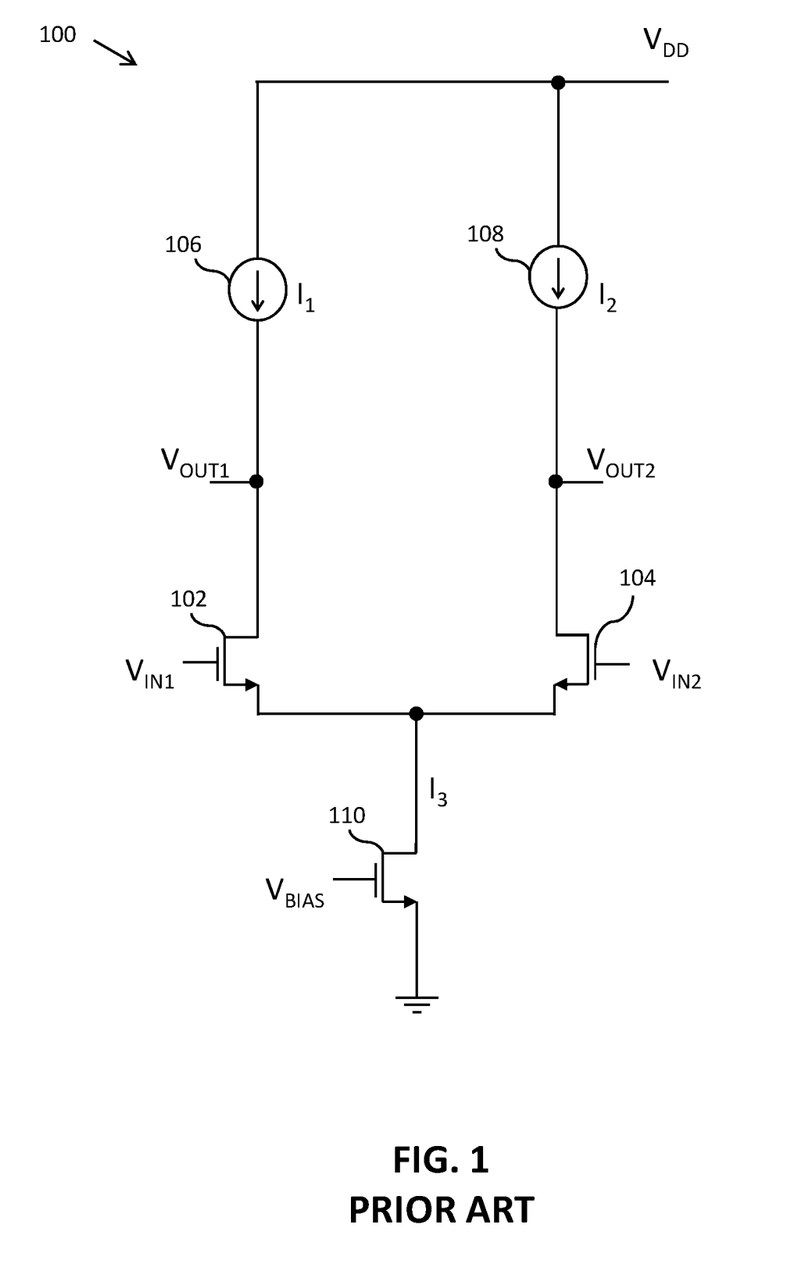
FIG. 1 illustrates a schematic circuit diagram of a conventional differential amplifier.

Referring now to FIG. 1, a conventional differential amplifier 100 is shown. The conventional differential amplifier 100 is operated in dual input and balanced output configuration. In the dual input balanced output configuration, the conventional differential amplifier 100 receives first and second input signals $V_{IN1}$ and $V_{IN2}$ by way of gate terminals of first and second transistors 102 and 104, respectively. The conventional differential amplifier 100 generates first and second output signals $V_{OUT1}$ and $V_{OUT2}$ at the drain terminals of the first and second transistors 102 and 104, respectively. The conventional differential amplifier 100 generates two types of output voltages—a differential output voltage and a common-mode output voltage. The differential output voltage is a difference between the first and second output signals $V_{OUT1}$ and $V_{OUT2}$. The common-mode output voltage is an average of the first and second output signals $V_{OUT1}$ and $V_{OUT2}$. A supply voltage signal $V_{DD}$ powers first and second current sources 106 and 108. The first and second current sources 106 and 108 generate first and second currents $I_1$ and $I_2$, respectively. The first and second current sources 106 and 108 consequently bias the first and second transistors 102 and 104, respectively. The conventional differential amplifier 100 includes the first and second current sources 106 and 108 to achieve high differential gain. The conventional differential amplifier 100 further includes a tail transistor 110 and a tail current $I_3$ passes through the tail transistor 110. In ideal conditions, the tail current $I_3$ is a sum of the first and second currents $I_1$ and $I_2$. However, the tail current $I_3$ tends to deviate from the value of the sum of the first and second currents $I_1$ and $I_2$, thereby causing current mismatch. The common-mode output voltage of the conventional differential amplifier 100 is susceptible to the current mismatch. The current mismatch causes variations in the common-mode output voltage of the conventional differential amplifier 100, thereby reducing the gain of the conventional differential amplifier 100. Thus, it is desirable to maintain the common-mode output voltage at a constant value to achieve high differential gain of the conventional differential amplifier 100.

Figure 2:
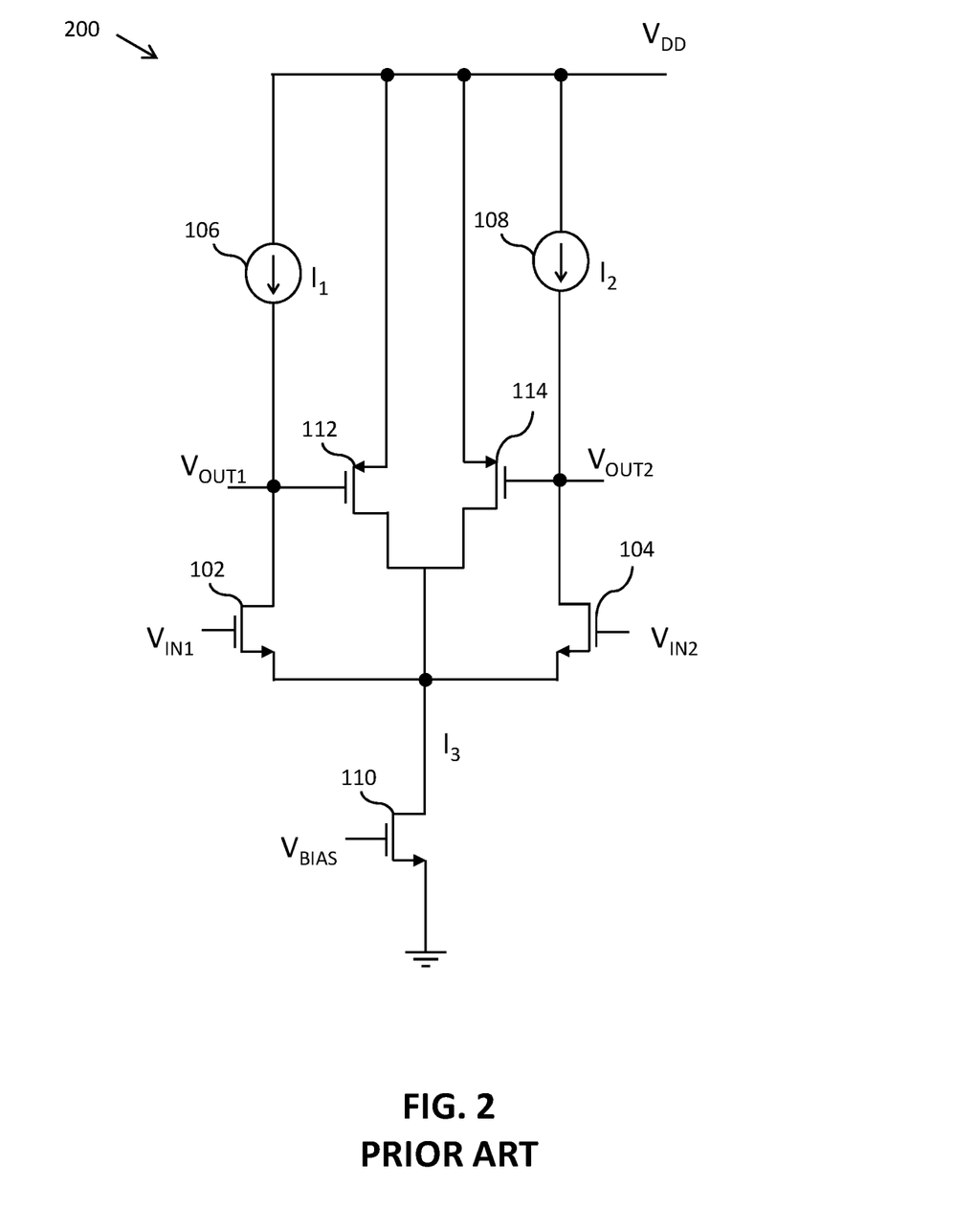
FIG. 2 illustrates a schematic circuit diagram of an alternate embodiment of the conventional differential amplifier of FIG. 1.

A known technique to solve the aforementioned problem is to measure and set the common-mode output voltage. FIG. 2 illustrates a differential amplifier 200 that measures and sets the common-mode output voltage using a single device feedback loop. The single device feedback loop includes first and second p-type metal-oxide-semiconductor (PMOS) transistors 112 and 114 that form a PMOS transistor pair. The first and second PMOS transistors 112 and 114 are structurally and functionally identical. A gate terminal of the first PMOS transistor 112 is connected to the drain terminal of the first transistor 102. Further, a gate terminal of the second PMOS transistor 114 is connected to the drain terminal of the second transistor 104. Further, source terminals of the PMOS transistor pair receive the supply voltage signal $V_{DD}$ and drain terminals of the PMOS transistor pair are connected to the drain terminal of the tail transistor 110. The single device feedback loop measures and sets the common-mode output voltage. Value of the common-mode output voltage $V_{CM}$ is given by the following equation:

$$V_{CM}=V_{DD}-V_{GS} \qquad (1)$$

where, $V_{CM}$ is the common-mode output voltage;

$V_{DD}$ is the supply voltage signal; and $V_{GS}$ is a difference between voltages at the gate terminal and the source terminal of the first or second PMOS transistor 112 or 114.

As indicated by the equation (1), any variations in the supply voltage signal $V_{DD}$ will change the common-mode output voltage $V_{CM}$ value as well. For instance, if the supply voltage signal $V_{DD}$ reduces, the values of the first and second output signals $V_{OUT1}$ and $V_{OUT2}$ reduce. Subsequently, the first and second input transistors 102 and 104 enter a triode region of operation. In the triode region of operation, differential gain of the differential amplifier 200 reduces which is undesirable. Also, due to decrease in the value of the supply voltage signal $V_{DD}$, the common-mode output voltage $V_{CM}$ decreases. Furthermore, there is no control over the value of the common-mode output voltage $V_{CM}$, as the supply voltage signal $V_{DD}$ and gate to source voltage of the PMOS transistor pair $V_{GS}$ cannot be changed frequently as per operational requirements.

Figure 3:
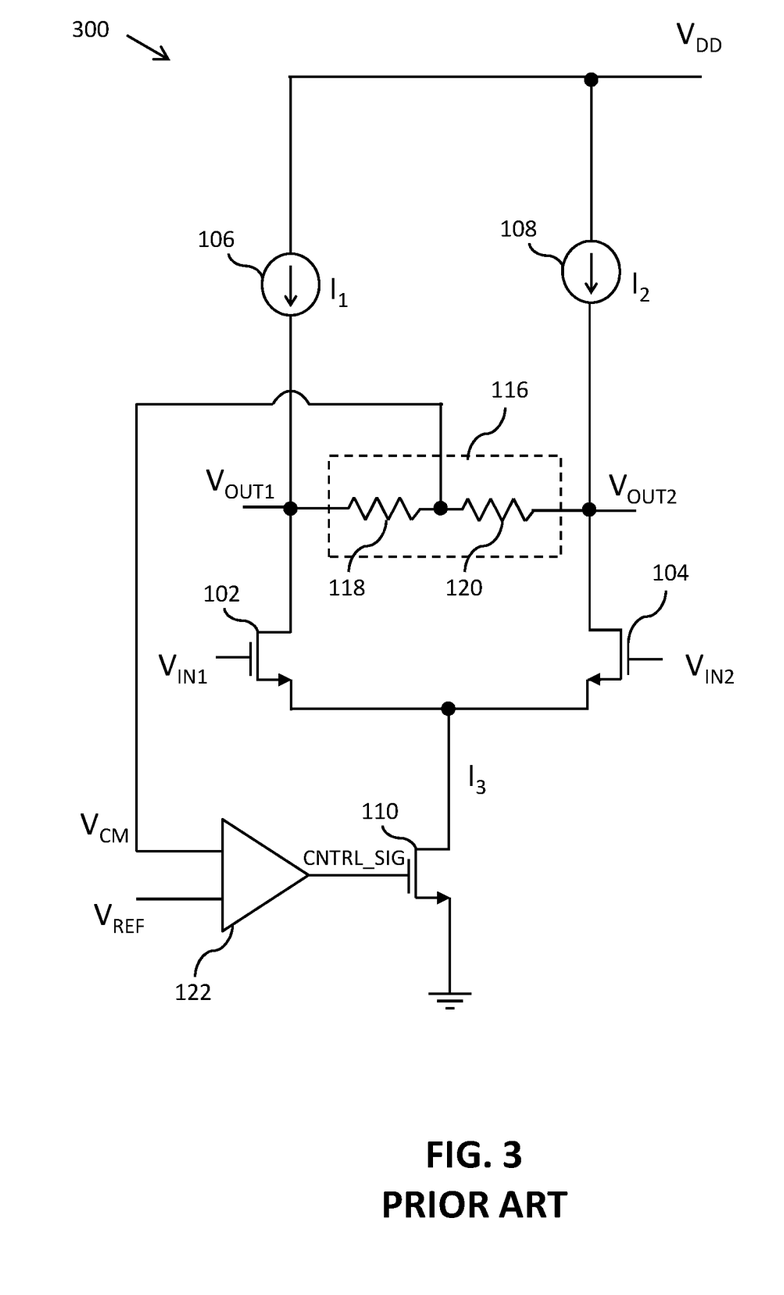
FIG. 3 illustrates a schematic circuit diagram of another alternate embodiment of the conventional differential amplifier of FIG. 1.

Another known technique to overcome the aforementioned problem is to control the common-mode output voltage $V_{CM}$ using a resistive averaging network with a negative feedback. FIG. 3 illustrates a differential amplifier 300 with a resistive averaging network 116 with the negative feedback. The resistive averaging network 116 includes first and second resistors 118 and 120. A first terminal of the first resistor 118 is connected to first output terminal of the differential amplifier 300; and a first terminal of the second resistor 120 is connected to second output terminal of the differential amplifier 300. Further, a second terminal of the first resistor 118 is connected to a second terminal of the second resistor 120. The resistive averaging network 116 outputs the common-mode output voltage $V_{CM}$ as the average of the first and second output signals $V_{OUT1}$ and $V_{OUT2}$ at the second terminal of the first resistor 118. An operational amplifier 122 receives the common-mode output voltage $V_{CM}$ and a reference voltage $V_{REF}$. Further, the operational amplifier 122 sets the common-mode output voltage $V_{CM}$ equal to the reference voltage $V_{REF}$. The operational amplifier 122 receives the common-mode output voltage $V_{CM}$ and the reference voltage $V_{REF}$ and generates a control signal CNTRL_SIG that adjusts the tail current $I_3$ of the differential amplifier 300 to maintain the value of the common-mode output voltage $V_{CM}$ equal to the reference voltage $V_{REF}$. Thus, the operational amplifier 122 compares the common-mode output voltage $V_{CM}$ with the reference voltage $V_{REF}$, and sets the common-mode output voltage $V_{CM}$ equal to the value of the reference voltage $V_{REF}$ using the negative feedback. However, the gain of the differential amplifier 300 is reduced by low resistance of the first and second resistors 118 and 120 of the resistive averaging network 116. The aforementioned problem is mitigated by the resistive averaging network 116 with the resistors of high resistance. However, the resistive averaging network 116 with the high resistance requires additional silicon area in an integrated circuit implementation of the differential amplifier 300. Further, the differential amplifier 300 includes a two stage feedback network. A first stage of the two stage feedback network is the operational amplifier 122 and a second stage is the tail transistor 110. It is known in the art that the two stage feedback network requires frequency compensation to ensure stability of the differential amplifier 300. Thus, the differential amplifier 300 is highly unreliable and extremely complex to implement.

Therefore, it would be advantageous to have a differential amplifier that sustains differential output voltage swings and current mismatch, provides an effective control on the common-mode output voltage, and provides a maximum differential output gain.

SUMMARY

In an embodiment of the present invention, a high gain differential amplifier with common mode feedback is provided. The high gain differential amplifier includes first through eighth transistors and first through third current sources. A common-mode output voltage of the high gain differential amplifier is controlled by a reference voltage. The first transistor has a gate terminal for receiving the reference voltage and a source terminal connected to the first current source. The first current source receives a supply voltage and outputs a first current. The common-mode output voltage is equal to the reference voltage. The second transistor has a gate terminal connected to a drain terminal thereof and a drain terminal of the first transistor, and a source terminal connected to ground. The third transistor has a gate terminal for receiving a first input voltage, and a drain terminal connected to the second current source. The second current source receives the supply voltage and outputs a second current. The second current flows through the third transistor. The fourth transistor has a gate terminal connected to the drain terminal of the third transistor, a source terminal connected to the source terminal of the first transistor, and a drain terminal connected to a source terminal of the third transistor. The fifth transistor has a gate terminal connected to the third current source, a source terminal connected to the source terminal of the first transistor, and a drain terminal connected to the source terminal of the third transistor. The third current source receives the supply voltage and outputs a third current. The first current flows through the first, fourth, and fifth transistors. The sixth transistor has a gate terminal for receiving a second input voltage, and a drain terminal connected to the gate terminal of the fifth transistor. The common-mode output voltage is measured between the drain terminal of the third transistor and the drain terminal of the sixth transistor. The third current flows through the sixth transistor. The seventh transistor has a gate terminal for receiving a bias voltage, a source terminal connected to the ground, and a drain terminal connected to the source terminal of the third transistor. A fourth current flows through the seventh transistor. The eighth transistor has a gate terminal connected to the gate terminal of the second transistors, a source terminal connected to the ground, and a drain terminal connected to the source terminal of the third transistor. A fifth current flows through the eighth transistor. Further, the fifth current changes proportionally to a mismatch between the fourth current and a sum of second and third current, thereby minimizing the mismatch.

In another embodiment of the present invention, a high gain differential amplifier with common mode feedback is provided. The high gain differential amplifier includes first through eighth transistors, first through third current sources, and first through third degeneration resistors. A common-mode output voltage of the high gain differential amplifier is controlled by a reference voltage. The first transistor has a gate terminal for receiving the reference voltage and a source terminal connected to a first terminal of the first degeneration resistor. A second terminal of the first degeneration resistor is connected to the first current source. The first current source receives a supply voltage and outputs a first current. The common-mode output voltage is equal to the reference voltage. The second transistor includes a gate terminal connected to a drain terminal thereof and a drain terminal of the first transistor, and a source terminal that receives a ground voltage. The third transistor has a gate terminal that receives a first input voltage, and a drain terminal connected to the second current source. The second current source receives the supply voltage and outputs a second current. The second current flows through the third transistor. The fourth transistor has a gate terminal connected to the drain terminal of the third transistor, a source terminal connected to a first terminal of the second degeneration resistor, and a drain terminal connected to a source terminal of the third transistor. A second terminal of the second degeneration resistor is connected to the first current source. The fifth transistor has a gate terminal connected to the third current source, a source terminal connected to a first terminal of the third degeneration resistor, and a drain terminal connected to the source terminal of the third transistor. The third current source receives the supply voltage and outputs a third current. A second terminal of the third degeneration resistor is connected to the first current source. The first current flows through the first, fourth, and fifth transistors. The sixth transistor has a gate terminal for receiving a second input voltage, and a drain terminal connected to the gate terminal of the fifth transistor. The common-mode output voltage is measured between the drain terminal of the third transistor and the drain terminal of the sixth transistor. The third current flows through the sixth transistor. The seventh transistor has a gate terminal for receiving a bias voltage, a source terminal connected to the ground, and a drain terminal connected to the source terminal of the third transistor. A fourth current flows through the seventh transistor. The eighth transistor has a gate terminal connected to the gate terminal of the second transistor, a source terminal connected to the ground, and a drain terminal connected to the source terminal of the third transistor. A fifth current flows through the eighth transistor. Further, the fifth current changes proportionally to a mismatch between the fourth current and a sum of second and third current, thereby minimizing the mismatch.

In yet another embodiment of the present invention, a high gain differential amplifier with common mode feedback is provided. The high gain differential amplifier includes first through eighth transistors and first through third current sources. A common-mode output voltage of the high gain differential amplifier is controlled by a reference voltage. The first transistor has a gate terminal for receiving the reference voltage, a source terminal connected to the first current source. The first current source is connected to ground and outputs a first current. The common-mode output voltage is equal to the reference voltage. The second transistor has a gate terminal connected to a drain terminal thereof and a drain terminal of the first transistor, and a source terminal for receiving a supply voltage. The third transistor has a gate terminal for receiving a first input voltage, and a drain terminal connected to the second current source. The second current source is connected to the ground and outputs a second current. The second current flows through the third transistor. The fourth transistor has a gate terminal connected to the drain terminal of the third transistor, a source terminal connected to the source terminal of the first transistor, and a drain terminal connected to a source terminal of the third transistor. The fifth transistor has a gate terminal connected to the third current source, a source terminal connected to the source terminal of the first transistor, and a drain terminal connected to the source terminal of the third transistor. The third current source is connected to the ground and outputs a third current. The first current flows through the first, fourth, and fifth transistors. The sixth transistor has a gate terminal for receiving a second input voltage, and a drain terminal connected to the gate terminal of the fifth transistor. The common-mode output voltage is measured between the drain terminal of the third transistor and the drain terminal of the sixth transistor. The third current flows through the sixth transistor. The seventh transistor has a gate terminal for receiving a bias voltage, a source terminal for receiving the supply voltage, and a drain terminal connected to the source terminal of the third transistor. A fourth current flows through the seventh transistor. The eighth transistor has a gate terminal connected to the gate terminal of the second transistor, a source terminal for receiving the supply voltage, and a drain terminal connected to the source terminal of the third transistor. A fifth current flows through the eighth transistor. Further, the fifth current changes proportionally to a mismatch between the fourth current and a sum of second and third current, thereby minimizing the mismatch.

The high gain differential amplifier provides an effective control on the common-mode output voltage a high differential output gain in spite of the current mismatch.

BRIEF DESCRIPTION OF DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

The detailed description of the appended drawings is intended as a description of the currently preferred embodiments of the present invention, and is not intended to represent the only form in which the present invention may be practised. It is to be understood that the same or equivalent functions may be accomplished by different embodiments that are intended to be encompassed within the spirit and scope of the present invention.

As used in the specification and claims, the singular forms "a", "an" and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional components described in the foregoing application that are not depicted on one of the described drawings. In the event such a component is described, but not depicted in a drawing, the absence of such a drawing should not be considered as an omission of such design from the specification.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 4:
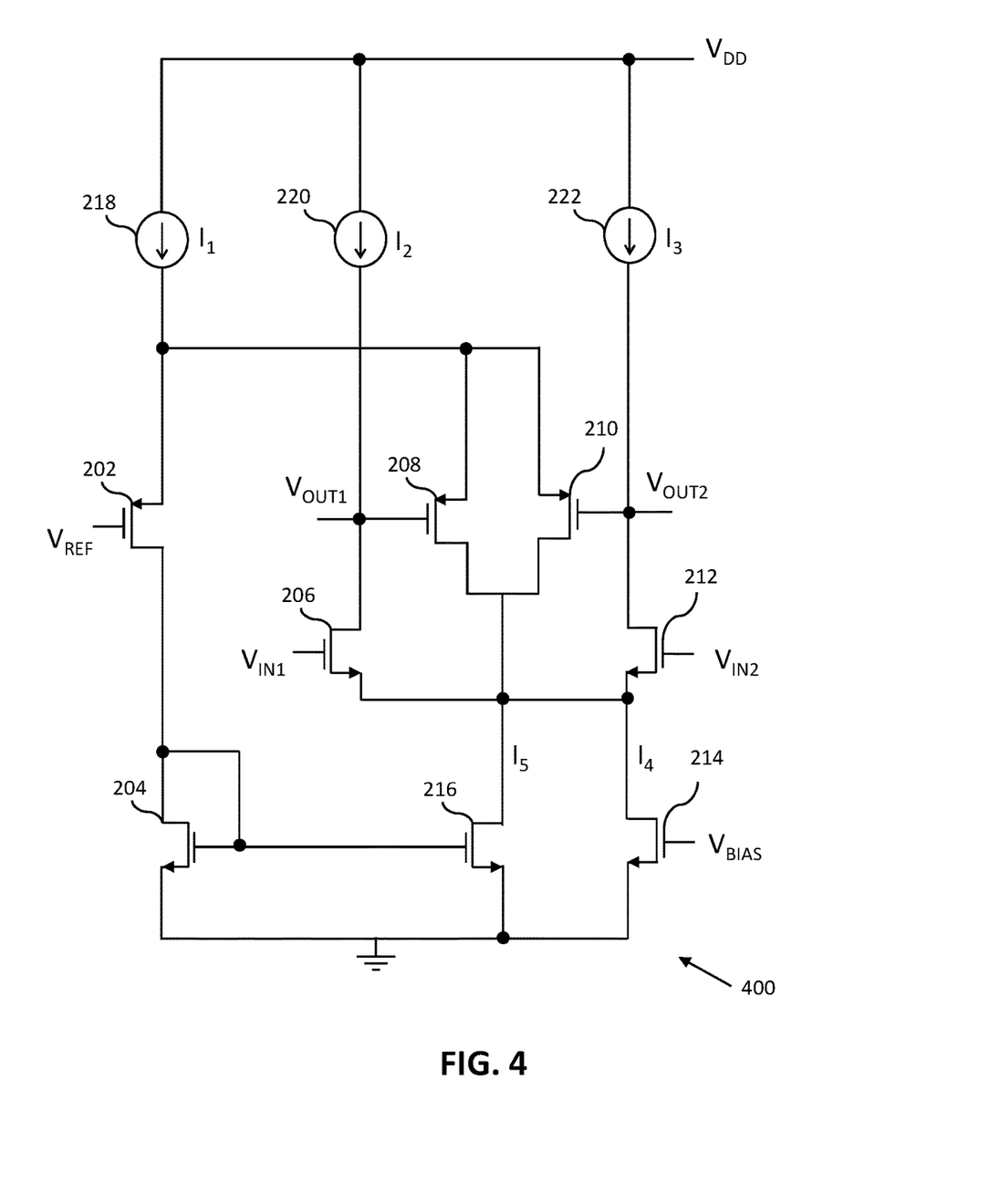
FIG. 4 illustrates a schematic circuit diagram of a high gain differential amplifier in accordance with an embodiment of the present invention.

Referring now to FIG. 4, a schematic circuit diagram of a high gain differential amplifier 400 in accordance with an embodiment of the present invention is shown. The high gain differential amplifier 400 includes first through eighth transistors 202-216 and first through third current sources 218-222. The high gain differential amplifier 400 is designed using complementary metal-oxide-semiconductor (CMOS) based transistors. The high gain differential amplifier 400 effectively rejects ambient noise signals. Hence, the high gain differential amplifier 400 is often used in mixed signal systems. Typically, the high gain differential amplifier 400 is operated in dual input and balanced output configuration. In the dual input balanced output configuration, the high gain differential amplifier 400 receives first and second input voltages VIN1 and VIN2 by way of gate terminals of the third and sixth transistors 206 and 212, respectively, and generates first and second output signals VOUT1 and VOUT2 at drain terminals of the third and sixth transistors 206 and 212, respectively. The fourth and fifth transistors 208 and 210 form a p-channel metal-oxide semiconductor (PMOS) transistor pair. The PMOS transistor pair measures output voltages of the high gain differential amplifier 400 by way of the gate terminals. It should be noted by the practitioner that the high gain differential amplifier 400 may also be operated in dual input and unbalanced output, single input and balanced output, and single input and unbalanced output configurations.

The high gain differential amplifier 400 generates two types of output voltages, a differential output voltage and a common-mode output voltage. The differential output voltage is a difference between the first and second output voltages VOUT1 and VOUT2. Further, the common-mode output voltage is an average of the first and second output voltages VOUT1 and VOUT2.

First terminals of the first, second, and third current sources 218, 220, and 222 are connected to a voltage source (not shown) and receive a supply voltage VDD. The first, second, and third current sources 218, 220, and 222 generate first, second, and third currents I1, I2, and I3, respectively.

In the preferred embodiment, a gate terminal of the first transistor 202 receives a reference voltage VREF and a source terminal of the first transistor 202 is connected to the first current source 218. One half of the first current (I1/2) flows through the first transistor 202. The reference voltage VREF sets the common-mode output voltage of the high gain differential amplifier 400 to the value of the reference voltage VREF. The second transistor 204 has a gate terminal connected to a drain terminal thereof and a drain terminal of the first transistor 202. A source terminal of the second transistor 204 is connected to ground. The second transistor 204 functions as a diode-connected transistor. The third transistor 206 has a gate terminal that receives the first input voltage VIN1 and a drain terminal connected to the second current source 220. Thus, the second current I2 flows through the third transistor 206.

The fourth transistor 208 has a gate terminal connected to the drain terminal of the third transistor 206, a source terminal connected to the source terminal of the first transistor 202 and the first current source 218, and a drain terminal connected to a source terminal of the third transistor 206. One fourth of the first current (I1/4) flows through the fourth transistor 208. The fifth transistor 210 has a gate terminal connected to the third current source 222, a source terminal connected to the source terminal of the first transistor 202, and a drain terminal connected to the source terminal of the third transistor 206. One fourth of the first current (I1/4) flows through the fifth transistor 210. The sixth transistor 212 has a gate terminal that receives the second input voltage VIN2, and a drain terminal connected to the gate terminal of the fifth transistor 210 and the third current source. The third current I3 flows through the sixth transistor 212. The first and second input voltages VIN1 and VIN2 provide a differential input to the high gain differential amplifier 400.

The common-mode output voltage is measured between the drain terminal of the third transistor 206 and the drain terminal of the sixth transistor 212 by the PMOS transistor pair. The seventh transistor 214 has a gate terminal that receives a bias voltage VBIAS. Due to the bias voltage VBIAS, a fourth current I4 flows through the seventh transistor 214. Further, the seventh transistor 214 has a source terminal that is connected to ground and a drain terminal that is connected to the source terminal of the sixth transistor 212. The eighth transistor 216 has a gate terminal connected to the gate terminal of the second transistor 204. Further, the eighth transistor 216 has a source terminal that is connected to ground, and a drain terminal that is connected to the source terminal of the sixth transistor 212. A fifth current I5 flows through the eighth transistor 216. The second and eighth transistors 204 and 216 form a current mirror circuit. The structure and operations of the current mirror circuit are well known in the art.

To maintain the common-mode output voltage equal to the reference voltage VREF, it is essential that a sum of the second and third currents I2 and I3 is equal to the fourth current I4. However, in a circuit implementation and practical applications of the high gain differential amplifier 400, a difference between the fourth current I4 and the sum of the second and third currents I3 and I4 occurs. The difference between the fourth current I4 and the sum of the second and third currents I2 and I3 is also referred to as current mismatch. The PMOS transistor pair and the current mirror circuit form a common mode feedback circuit for reducing the current mismatch. The common mode feedback circuit alters the fifth current I5 such that the current mismatch is minimized. The change in the fifth current I5 is proportional to the current mismatch.

In the presently preferred embodiment, sizes of the fourth and fifth transistors 208 and 210 are equal. The size of the first transistor 202 is twice the size of each of the fourth and fifth transistors 208 and 210. It is well known in the art that the size of a field effect transistor is defined by width to length ratio (W/L). Thus, the PMOS transistor pair is equivalent to the first transistor 202 and therefore equal parts of the first current I1 flow through the first transistor 202 and the PMOS transistor pair i.e. half of the first current (I1/2) flows through the first transistor 202 and the other half of the first current (I1/2) flows through the PMOS transistor pair.

In one embodiment, the first, fourth, and fifth transistors 202, 208, and 210, respectively, are p-channel field-effect transistors and the second, third, sixth, seventh, and eighth transistors 204, 206, 212, 214 and 216, respectively, are n-channel field-effect transistors. Typically, the gate voltages of the fourth and fifth transistors 208 and 210 are equal and the second and third current sources 220 and 222 generate the same currents i.e. the second current I2 is equal to the third current I3. The common-mode output voltage of the high gain differential amplifier 400 is measured by the PMOS transistor pair. The PMOS transistor pair calibrates the output of the third and sixth transistors 206 and 212 based on the reference voltage VREF.

In an example, the first and second input voltages VIN1 and VIN2 of the high gain differential amplifier 400 are 3.3 Volts (V) and 4 V, respectively. Further, each of the second and third current I2 and I3 values is 10 milliamperes (mA) when the supply voltage VDD is 5 V, and the common-mode output voltage is equal to the reference voltage VREF. Further, the first current source 218 generates the first current I1 of 8 mA when the supply voltage VDD is 5 V. The first current I1 of 8 mA is equally divided to flow through the first transistor 202 and the PMOS transistor pair due to the sizes of the first, fourth and fifth transistors 202, 208 and 210. Thus, a current of 4 mA flows through the first transistor 202 and a current of 4 mA flows through the PMOS transistor pair. Further, a current of 2 mA flows through the fourth transistor 208, and a current of 2 mA flows through the fifth transistor 210. As the second transistor 204 is in series with the first transistor 202, a current of 4 mA flows through the second transistor 204. Thus, in an ideal scenario, the fifth current I5 flowing through the eighth transistor 216 is equal to 4 mA based on the properties of the current mirror circuit. Further, the fourth current I4 flowing through seventh transistor 214 is equal to 20 mA. As the sum of the second and third currents I2 and I3 is equal to the fourth current I4 flowing through the seventh transistor 214, there is no current mismatch in the high gain differential amplifier 400 and the common-mode output voltage is equal to the reference voltage VREF.

Due to introduction of ambient noise in the high gain differential amplifier 400 and operation of the high gain differential amplifier 400 at various process, voltage, and temperature (PVT) parameters the value of the fourth current I4 starts deviating from the sum of the second and the third currents I2 and I3, thereby causing the current mismatch. The current mismatch causes the common-mode output voltage of the high gain differential amplifier 400 to deviate from the reference voltage VREF. Subsequently, the gain of the high gain differential amplifier 400 is reduced due to the change in the common-mode output voltage. The current mismatch occurs when the fourth current I4 is either greater or less than the sum of the second and the third currents I2 and I3.

In an example, the current mismatch results in an increase in the sum of the second and third currents I2 and I3 as compared to the value of the fourth current I4, and the common-mode output voltage increases as compared to the reference voltage VREF. As the value of the common-mode output voltage is high, voltages at the gate terminals of the fourth and fifth transistors 208 and 210 are high. Due to high voltages at the gate terminals of the fourth and fifth transistors 208 and 210, there is an increase in the voltage at the source terminals of the fourth and fifth transistors 208 and 210. As the first current I1 flows through the first, fourth, and fifth transistors 202, 208, and 210, the current flowing through the first transistor 202 increases to balance the increase in the voltages at the source terminals of the fourth and the fifth transistors 208 and 210. The increase in the current flowing through the first transistor 202 increases the voltage at the source terminal of the first transistor 202. As the same current flows through the first and the second transistors 202 and 204, the current flowing through the second transistor 204 increases due to the increase in the current flowing through the first transistor 202. The increase in the current flowing through the second transistor 204 is mirrored at the eighth transistor 216, thereby increasing the value of the fifth current I5. Due to the increase in the value of the fifth current I5, the current mismatch decreases and the common-mode output voltage becomes equal to the reference voltage VREF. The increase in the value of the fifth current I5 is proportional to the current mismatch between the sum of the second and third currents I2 and I3 and the value of the fourth current I4. The common mode feedback is triggered by the PMOS transistor pair and the current mirror circuit adjusts the value of the fifth current I5 to reduce the current mismatch.

In another example, the current mismatch results in a decrease in the sum of the second and the third currents I2 and I3 as compared to the value of the fourth current I4, and the common-mode output voltage decreases as compared to the reference voltage VREF. As the value of the common-mode output voltage is low, voltages at the gate terminals of the fourth and fifth transistors 208 and 210 is low. Due to low voltages at the gate terminals of the fourth and fifth transistors 208 and 210, there is a decrease in the voltage at the source terminals of the fourth and fifth transistors 208 and 210. As the first current I1 flows through the first, fourth, and fifth transistors 202, 208, and 210, the current flowing through the first transistor 202 decreases due to the decrease in the voltages at the source terminals of the fourth and the fifth transistors 208 and 210. As the same current flows through the first and second transistors 202 and 204, the current flowing through the second transistor 204 decreases due to the decrease in the current flowing through the first transistor 202. The decrease in the current flowing through the second transistor 204 is mirrored at the eighth transistor 216, thereby decreasing the value of the fifth current I5. Due to the decrease in the value of the fifth current I5, the current mismatch decreases and the common-mode output voltage becomes equal to the reference voltage VREF. The decrease in the value of the fifth current I5 is proportional to the current mismatch between the sum of the second and third currents I2 and I3 and the value of the fourth current I4.

As the diode-connected transistor 204 provides low impedance, a first node (not shown) between the drain terminal of the first transistor 202 and the drain terminal of the second transistor 204 is a low impedance node. The drain terminal of the eighth transistor 216 is connected to the source terminal of the third transistor 206, forming a second node (not shown). The second node is also a low impedance node in the high gain differential amplifier 400. As the common mode feedback circuit of the high gain differential amplifier 400 includes low impedance nodes, the need for frequency compensation to ensure stability of the high gain differential amplifier 400 is eliminated. It is well known in the art that the low impedance node represents a pole at higher frequencies, thereby improving the stability of the high gain differential amplifier 400. Calculations and implications of the poles and zeros of a differential circuit are also well known to a person skilled in the art.

Moreover, the bias voltage VBIAS is applied at the gate terminal of the seventh transistor 214. The bias voltage VBIAS is set up such that the seventh transistor 214 always operates in the saturated mode of operation. In the saturated mode of operation, the seventh transistor 214 operates as a current source. In an example, the bias voltage VBIAS is 1.8 V volts. The bias voltage VBIAS is received from a bias circuit (not shown). In an alternate embodiment, the seventh transistor 214 may be replaced by the current source.

Figure 5:
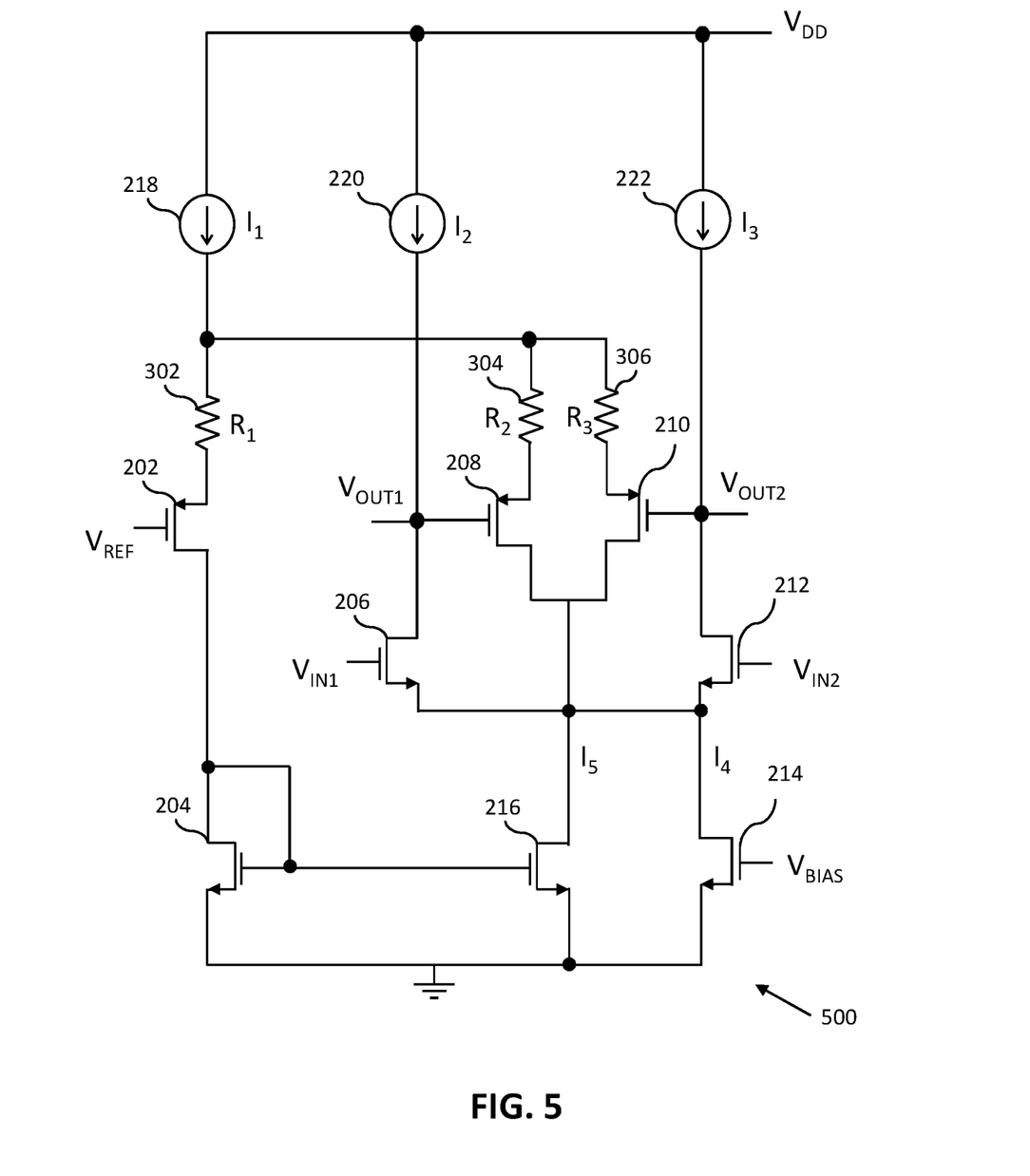
FIG. 5 illustrates a schematic circuit diagram of the high gain differential amplifier of FIG. 4 in accordance with another embodiment of the present invention.

Referring now to FIG. 5, a schematic circuit diagram of a high gain differential amplifier 500 in accordance with another embodiment of the present invention is shown. The high gain differential amplifier 500 includes the first through eighth transistors 202-216, the first through third current sources 218-222, and first through third degeneration resistors 302-306. The high gain differential amplifier 500 in FIG. 5 is structurally and functionally similar to the high gain differential amplifier 400 in FIG. 4. The high gain differential amplifier 500 includes the first through third degeneration resistors 302-306 in addition to the first through eighth transistors 202-216 and the first through third current sources 218-222 of the high gain differential amplifier 400 of FIG. 4. The first degeneration resistor 302 has a first terminal connected to the source terminal of the first transistor 202 and a second terminal connected to the first current source 218. The second degeneration resistor 304 has a first terminal connected to the source terminal of the fourth transistor 208 and a second terminal connected to the second terminal of the first degeneration resistor 302. The third degeneration resistor 306 has a first terminal connected to the source terminal of the fifth transistor 210 and a second terminal connected to the second terminal of the first degeneration resistor 302. The first through third degeneration resistors 302-306 increase tolerance of the high gain differential amplifier 500 due to irregular variations in the supply voltage VDD. The first through third degeneration resistors 302-306 stabilize the common-mode output voltage in presence of the ambient noise. Additionally, the first through third degeneration resistors 302-306 increase robustness of the high gain differential amplifier 500 to voltage swings in the differential output voltage. Due to the voltage swing in the differential output voltage, the first current I1 tends to flow entirely in either the first transistor 202 or the PMOS transistor pair. The first through third degeneration resistors 302-306 decrease the value of transconductance of each of the first, fourth, and fifth transistors 202, 208, and 210. As a result, the differential and the common-mode output voltages of the differential amplifier 500 become stable in an event of voltage swing in the differential output voltage.

Figure 6:
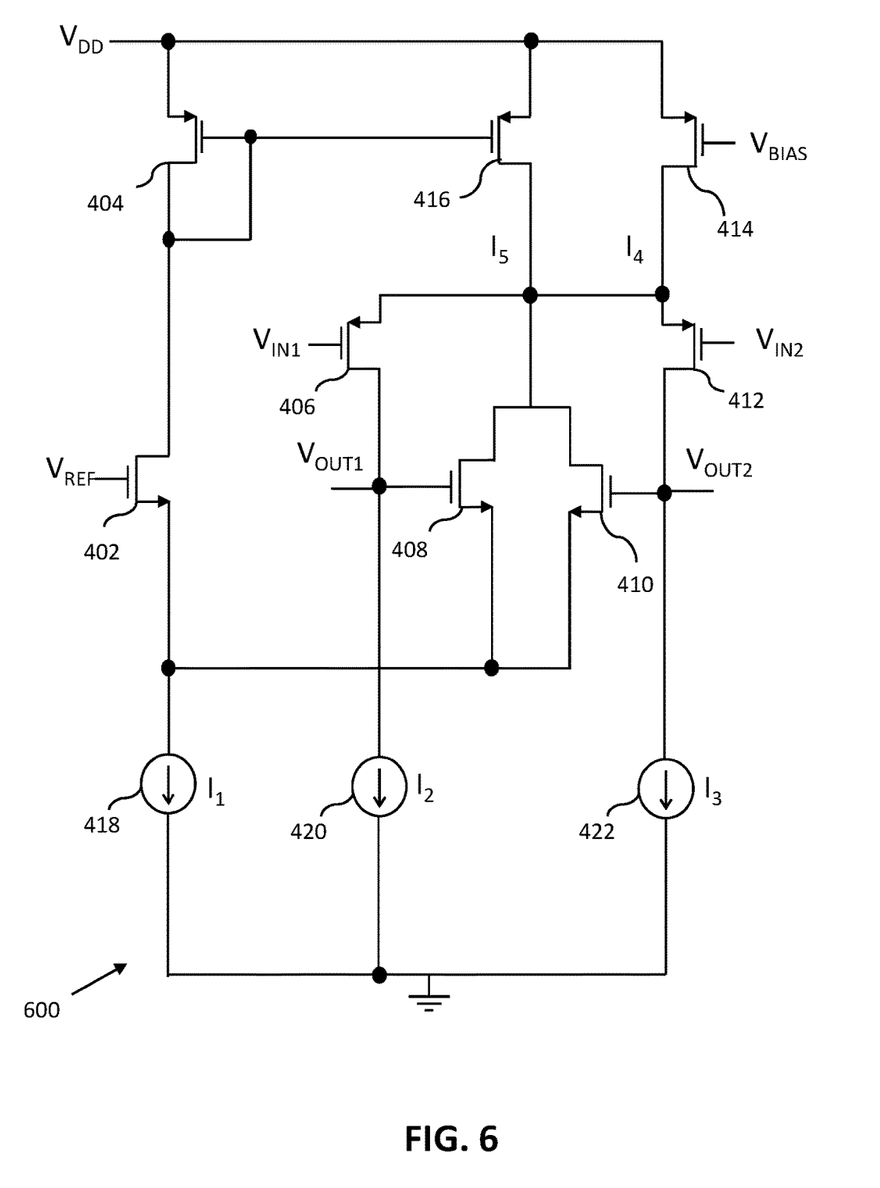
FIG. 6 illustrates a schematic circuit diagram of the high gain differential amplifier of FIG. 4 in accordance with another embodiment of the present invention.

Referring now to FIG. 6, a schematic circuit diagram of a high gain differential amplifier 600 in accordance with another embodiment of the present invention is shown. The high gain differential amplifier 600 includes first through eighth transistors 402-416, and first through third current sources 418-422. The high gain differential amplifier 600 of the FIG. 6 is functionally similar to the high gain differential amplifier 400 of the FIG. 4. The high gain differential amplifier 600 of the FIG. 6 is a complimentary version of the high gain differential amplifier 400 of the FIG. 4. The first, fourth, and fifth transistors 402, 408, and 410 are n-channel field-effect transistors and the second, third, sixth, seventh, and eighth 404, 406, 412, 414, and 416 transistors are p-channel field-effect transistors. The fourth and fifth transistors 408 and 410 form an n-channel metal-oxide semiconductor (NMOS) transistor pair. The NMOS transistor pair measures the common-mode output voltage of the high gain differential amplifier 600.

First terminals of the first, second, and third current sources 418, 420, and 422 are connected to the ground. The first, second, and third current sources 418, 420, and 422 generate first, second, and third currents I1, I2, and I3, respectively.

A gate terminal of the first transistor 402 receives the reference voltage VREF and a source terminal of the first transistor 402 is connected to the first current source 418. The reference voltage VREF is used to set the common-mode output voltage of the high gain differential amplifier 600 to the value of the reference voltage VREF. The first current I1 flows through the first transistor 402. The second transistor 404 has a gate terminal connected to a drain terminal thereof and a drain terminal of the first transistor 402, and a source terminal for receiving the source voltage VDD. The second transistor 404 functions as a diode connected transistor. The third transistor 406 has a gate terminal that receives the first input voltage VIN1, and a drain terminal connected to the second current source 420. The second current I2 flows through the third transistor 406. The fourth transistor 408 has a gate terminal connected to the drain terminal of the third transistor 406, a source terminal connected to the source terminal of the first transistor 402, and a drain terminal connected to a source terminal of the third transistor 406. The fifth transistor 410 has a gate terminal connected the third current source 422, a source terminal connected to the source terminal of the first transistor 402, and a drain terminal connected to the source terminal of the third transistor 406. The third current I3 flows through the sixth transistor 412. The sixth transistor 412 has a gate terminal that receives the second input voltage VIN2, and a drain terminal connected to the gate terminal of the fifth transistor 410. The first and second input voltages VIN1 and VIN2 provide differential input to the high gain differential amplifier 600. The common-mode output voltage is measured between the drain terminal of the third transistor 406 and the drain terminal of the sixth transistor 412. The seventh transistor 414 has a gate terminal that receives the bias voltage VBIAS. Due to the bias voltage VBIAS a fourth current I4 flows through the seventh transistor 414. Further, the seventh transistor 414 includes a source terminal that receives a supply voltage VDD and a drain terminal that is connected to the source terminal of the sixth transistor 412. The eighth transistor 416 has a gate terminal connected to the gate terminal of the second transistor 404. Further, the eighth transistor 416 has a source terminal that receives the supply voltage VDD and a drain terminal that is connected to the source terminal of the sixth transistor 412. A fifth current I5 flows through the eighth transistor 416. The second and the eighth transistors 404 and 416 form the current mirror circuit.

To maintain the common-mode output voltage equal to the reference voltage VREF, it is essential that the sum of the second and the third currents I2 and I3 is equal to the fourth current I4. However, in circuit implementation and practical applications of the high gain differential amplifier 600, the difference between the fourth current I4 and the sum of the second and third currents I2 and I3 occurs. The difference between the fourth current I4 and the sum of the second and third currents I2 and I3 is also referred to as the current mismatch. The NMOS transistor pair and the current mirror circuit form a common mode feedback circuit for reducing the current mismatch. The common mode feedback circuit alters the fifth current I5 such that the current mismatch is minimized. The change in the fifth current I5 is proportional to the current mismatch.

Figure 7:
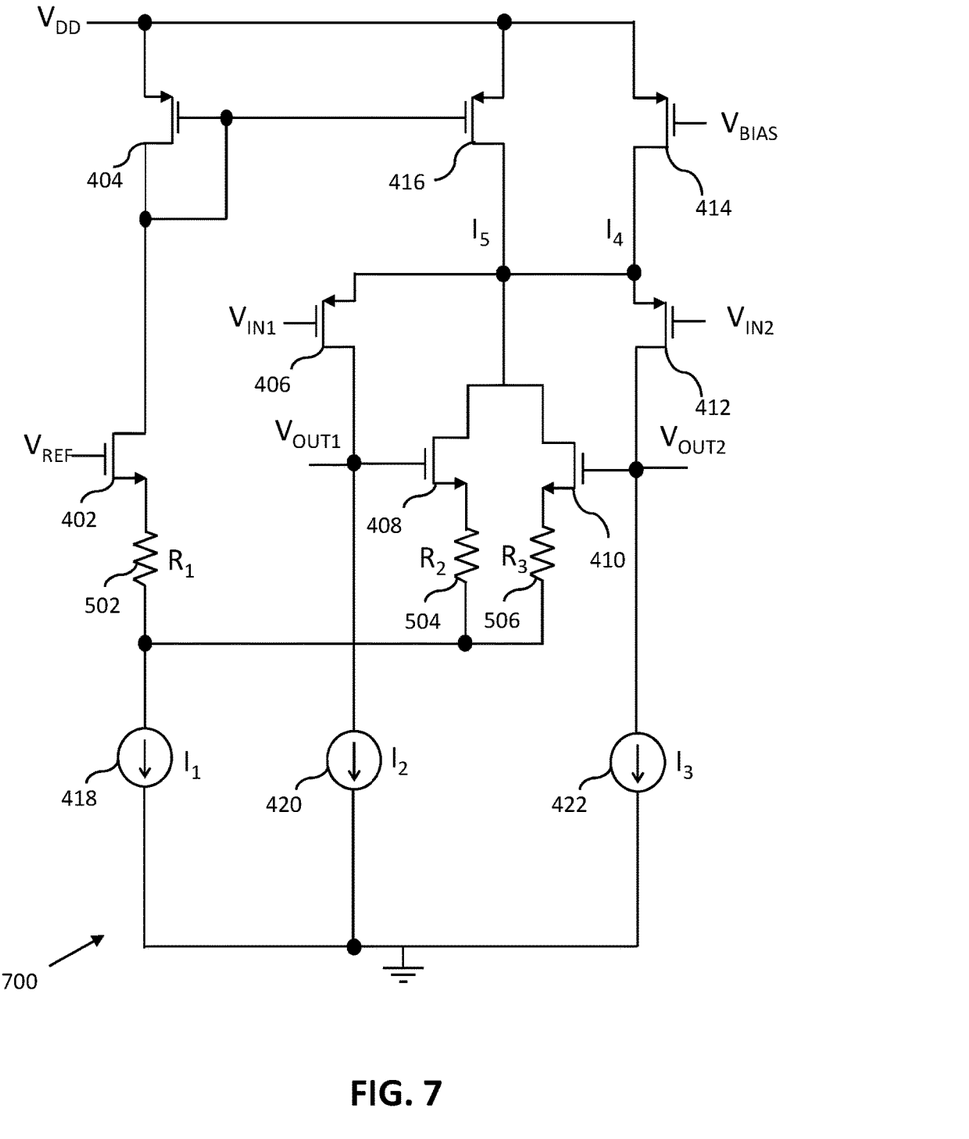
FIG. 7 illustrates a schematic circuit diagram of the high gain differential amplifier of FIG. 4 in accordance with another embodiment of the present invention.

Referring now to FIG. 7, a schematic circuit diagram of a high gain differential amplifier 700 in accordance with another embodiment of the present invention is shown. The high gain differential amplifier 700 includes the first through eighth transistors 402-416, first through third current sources 418-422, and first through third degeneration resistors 502-506. The high gain differential amplifier 700 in FIG. 7 is structurally and functionally similar to the high gain differential amplifier 600 in FIG. 6. The high gain differential amplifier 700 of FIG. 7 includes the first through third degeneration resistors 502-506 in addition to the circuit components of the high gain differential amplifier 600 of FIG. 6. The first degeneration resistor 402 has a first terminal connected to the source terminal of the first transistor 402 and a second terminal connected to the first current source 418. The second degeneration resistor 504 has a first terminal connected to the source terminal of the fourth transistor 408 and a second terminal connected to the second terminal of the first degeneration resistor 502. The third degeneration resistor 506 has a first terminal connected to the source terminal of the fifth transistor 410 and a second terminal connected to the second terminal of the first degeneration resistor 502. The first through third degeneration resistors 502-506 increase the tolerance of the high gain differential amplifier 700 to irregular variations in the supply voltage VDD. The first through third degeneration resistors 502-506 further stabilizes the common-mode output voltage in the presence of the ambient noise. Additionally, the first through third degeneration resistors 502-506 increase the robustness of the differential amplifier 700 to voltage swings in the differential output voltage. Due to the voltage swings in the differential output voltage, the first current I1 tends to flow entirely in either the first transistor 402 or the NMOS transistor pair. The first through third degeneration resistors 502-506 decrease the value of transconductance of each of the first, fourth, and fifth transistors 402, 408, and 410. The decrease in the value of the transconductance achieves stability in the output of the differential amplifier 700 in an event of voltage swing in the differential output voltage.

The high gain differential amplifiers 400, 500, 600, and 700 detect the current mismatch during amplification of the input voltages VIN1 and VIN2 and minimize the effects of the current mismatch and the voltage swings in the differential output voltages efficiently. The common-mode output voltage of the high gain differential amplifiers 400, 500, 600, and 700 may be changed by changing the reference voltage VREF. Also, variations in the common mode output voltages due to the current mismatch and the voltage swings are minimized by the common mode feedback. Thus, the high gain differential amplifiers 400, 500, 600, and 700 effectively control the common-mode output voltage by way of the common mode feedback. The control of the common-mode output voltage maintains the stability of the gain of the high gain differential amplifiers 400, 500, 600, and 700 during the amplification of input voltages. Further, each of the PMOS and NMOS transistor pairs provide for an accurate measurement of the output voltages VOUT1 and VOUT2 of the high gain differential amplifiers 400, 500, 600, and 700. Furthermore, the p-channel field-effect transistors and the n-channel field-effect transistors consume very less silicon area of an integrated circuit (IC). Therefore, the circuit implementation of the high gain differential amplifiers 400, 500, 600, and 700 consume minimal silicon area of the IC.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A high gain differential amplifier, wherein a common-mode output voltage is controlled by a reference voltage, the high gain differential amplifier comprising:
    a first transistor having a gate terminal for receiving the reference voltage, a source terminal connected to a first current source, wherein the first current source receives a supply voltage and outputs a first current, and wherein the common-mode output voltage is equal to the reference voltage;
    a second transistor having a gate terminal connected to a drain terminal thereof and a drain terminal of the first transistor, and a source terminal connected to ground;
    a third transistor having a gate terminal for receiving a first input voltage, and a drain terminal connected to a second current source, wherein the second current source receives the supply voltage and outputs a second current, and wherein the second current flows through the third transistor;
    a fourth transistor having a gate terminal connected to the drain terminal of the third transistor, a source terminal connected to the source terminal of the first transistor, and a drain terminal connected to a source terminal of the third transistor;
    a fifth transistor having a gate terminal connected to a third current source, a source terminal connected to the source terminal of the first transistor, and a drain terminal connected to the source terminal of the third transistor, wherein the third current source receives the supply voltage and outputs a third current, and wherein the first current flows through the first, fourth, and fifth transistors;
    a sixth transistor having a gate terminal for receiving a second input voltage, and a drain terminal connected to the gate terminal of the fifth transistor, wherein the common-mode output voltage is measured between the drain terminal of the third transistor and the drain terminal of the sixth transistor, and wherein the third current flows through the sixth transistor;
    a seventh transistor having a gate terminal for receiving a bias voltage, a source terminal connected to ground, and a drain terminal connected to the source terminal of the third transistor, wherein a fourth current flows through the seventh transistor; and
    an eighth transistor having a gate terminal connected to the gate terminal of the second transistor, a source terminal connected to ground, and a drain terminal connected to the source terminal of the third transistor, wherein a fifth current flows through the eighth transistor, and wherein the fifth current changes proportionally to a mismatch between the fourth current and a sum of second and third current, thereby minimizing the mismatch.

2. The high gain differential amplifier of claim 1, wherein the second and the eighth transistors form a current mirror circuit.

3. The high gain differential amplifier of claim 1, wherein the first, fourth, and fifth transistors are p-channel field-effect transistors and the second, third, sixth, seventh, and eighth transistors are n-channel field-effect transistors.

4. The high gain differential amplifier of claim 1, wherein the bias voltage is set to a value such that the seventh transistor operates in a saturated mode of operation.

5. A high gain differential amplifier, wherein a common-mode output voltage is controlled by a reference voltage, the high gain differential amplifier comprising:
    a first transistor having a gate terminal for receiving the reference voltage, a source terminal connected to a first terminal of a first degeneration resistor, wherein a second terminal of the first degeneration resistor is connected to a first current source, wherein the first current source receives a supply voltage and outputs a first current, and wherein the common-mode output voltage is equal to the reference voltage;
    a second transistor having a gate terminal connected to a drain terminal thereof and a drain terminal of the first transistor, and a source terminal connected to ground;
    a third transistor having a gate terminal for receiving a first input voltage, and a drain terminal connected to a second current source, wherein the second current source receives the supply voltage and outputs a second current, wherein the second current flows through the third transistor;
    a fourth transistor having a gate terminal connected to the drain terminal of the third transistor, a source terminal connected to a first terminal of a second degeneration resistor, and a drain terminal connected to a source terminal of the third transistor, wherein a second terminal of the second degeneration resistor is connected to the first current source;
    a fifth transistor having a gate terminal connected to a third current source, a source terminal connected to a first terminal of a third degeneration resistor, and a drain terminal connected to the source terminal of the third transistor, wherein the third current source receives the supply voltage and outputs a third current, wherein a second terminal of the third degeneration resistor is connected to the first current source, and wherein the first current flows through the first, fourth, and fifth transistors;
    a sixth transistor having a gate terminal for receiving a second input voltage, and a drain terminal connected to the gate terminal of the fifth transistor, wherein the common-mode output voltage is measured between the drain terminal of the third transistor and the drain terminal of the sixth transistor, wherein the third current flows through the sixth transistor;

a seventh transistor having a gate terminal for receiving a bias voltage, a source terminal connected to ground, and a drain terminal connected to the source terminal of the third transistor, wherein a fourth current flows through the seventh transistor; and an eighth transistor having a gate terminal connected to the gate terminal of the second transistor, a source terminal connected to ground, and a drain terminal connected to the source terminal of the third transistor, wherein a fifth current flows through the eighth transistor, and wherein the fifth current changes proportionally to a mismatch between the fourth current and a sum of second and third current, thereby minimizing the mismatch.

6. The high gain differential amplifier of claim 5, wherein the second and the eighth transistors form a current mirror circuit.

7. The high gain differential amplifier of claim 5, wherein the first, fourth, and fifth transistors are p-channel field-effect transistors and the second, third, sixth, seventh, and eighth transistors are n-channel field-effect transistors.

8. The high gain differential amplifier of claim 5, wherein the bias voltage is set to a value such that the seventh transistor operates in a saturated mode of operation.

9. A high gain differential amplifier, wherein a common-mode output voltage is controlled by a reference voltage, the high gain differential amplifier comprising:

a first transistor having a gate terminal for receiving the reference voltage, a source terminal connected to a first current source, wherein the first current source is connected to ground and outputs a first current, and wherein the common-mode output voltage is equal to the reference voltage;

a second transistor having a gate terminal connected to a drain terminal thereof and a drain terminal of the first transistor, and a source terminal for receiving a supply voltage;

a third transistor having a gate terminal for receiving a first input voltage, and a drain terminal connected to a second current source, wherein the second current source is connected to ground and outputs a second current, and wherein the second current flows through the third transistor;

a fourth transistor having a gate terminal connected to the drain terminal of the third transistor, a source terminal connected to the source terminal of the first transistor, and a drain terminal connected to a source terminal of the third transistor;

a fifth transistor having a gate terminal connected to a third current source, a source terminal connected to the source terminal of the first transistor, and a drain terminal connected to the source terminal of the third transistor, wherein the third current source is connected to ground and outputs a third current, and wherein the first current flows through the first, fourth, and fifth transistors;

a sixth transistor having a gate terminal for receiving a second input voltage, and a drain terminal connected to the gate terminal of the fifth transistor, wherein the common-mode output voltage is measured between the drain terminal of the third transistor and the drain terminal of the sixth transistor, and wherein the third current flows through the sixth transistor;

a seventh transistor having a gate terminal for receiving a bias voltage, a source terminal for receiving the supply voltage, and a drain terminal connected to the source terminal of the third transistor, wherein a fourth current flows through the seventh transistor; and an eighth transistor having a gate terminal connected to the gate terminal of the second transistor, a source terminal for receiving the supply voltage, and a drain terminal connected to the source terminal of the third transistor, wherein a fifth current flows through the eighth transistor, and wherein the fifth current changes proportionally to a difference between the fourth current and a sum of second and third current, thereby minimizing the difference.

10. The high gain differential amplifier of claim 9, further comprising:

a first degeneration resistor having a first terminal connected to the source terminal of the first transistor and a second terminal connected to the first current source;

a second degeneration resistor having a first terminal connected to the source terminal of the fourth transistor and a second terminal connected to the second terminal of the first degeneration resistor; and a third degeneration resistor having a first terminal connected to the source terminal of the fifth transistor and a second terminal connected to the second terminal of the first degeneration resistor.

11. The high gain differential amplifier of claim 9, wherein the second and the eighth transistors form a current mirror circuit.

12. The high gain differential amplifier of claim 9, wherein the first, fourth, and fifth transistors are n-channel field-effect transistors and the second, third, sixth, seventh, and eighth transistors are p-channel field-effect transistors.

13. The high gain differential amplifier of claim 9, wherein the bias voltage is set to a value such that the seventh transistor operates in a saturated mode of operation.

* * * * *

UNITED STATES PATENT AND TRADEMARK OFFICE
CERTIFICATE OF CORRECTION

PATENT NO. : 10,236,843 B2
APPLICATION NO. : 15/862510
DATED : March 19, 2019
INVENTOR(S) : Jayesh Wadekar et al.

It is certified that error appears in the above-identified patent and that said Letters Patent is hereby corrected as shown below:

On the Title Page

Under Inventors (72), after "Biman Chattopadhyay" delete "Karnataka (JP)" and insert --Karnataka (IN)--.

Signed and Sealed this
Twenty-ninth Day of October, 2019

Andrei Iancu
*Director of the United States Patent and Trademark Office*